United States Patent
Oh et al.

(10) Patent No.: US 7,817,465 B2
(45) Date of Patent: *Oct. 19, 2010

(54) PHASE CHANGE RANDOM ACCESS MEMORY

(75) Inventors: Hyung-rok Oh, Yongin-si (KR);
Woo-yeong Cho, Suwon-si (KR);
Beak-hyung Cho, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/453,420

(22) Filed: May 11, 2009

(65) Prior Publication Data

US 2009/0225590 A1 Sep. 10, 2009

Related U.S. Application Data

(63) Continuation of application No. 11/896,721, filed on Sep. 5, 2007, now Pat. No. 7,548,451.

(30) Foreign Application Priority Data

Sep. 5, 2006 (KR) .................. 10-2006-0085253

(51) Int. Cl.
*G11C 11/00* (2006.01)
(52) U.S. Cl. .................. 365/163; 365/211; 365/222
(58) Field of Classification Search ............ 365/163, 365/203, 211, 212, 222

See application file for complete search history.

(56) References Cited

U.S. PATENT DOCUMENTS

| 6,809,978 | B2 | 10/2004 | Alexander et al. ........... 365/211 |
| 6,868,025 | B2 | 3/2005 | Hsu ........................... 365/211 |
| 6,870,783 | B2 | 3/2005 | Kwak et al. ................. 365/201 |
| 6,885,602 | B2 | 4/2005 | Cho et al. .................... 365/211 |
| 6,982,913 | B2 | 1/2006 | Oh et al. ..................... 365/203 |

(Continued)

FOREIGN PATENT DOCUMENTS

JP 2004-273110 9/2004

(Continued)

OTHER PUBLICATIONS

Korean Notice of Allowance dated Jan. 31, 2008 for corresponding Korean Patent Application No. 10-2006-0085253.

(Continued)

*Primary Examiner*—Richard Elms
*Assistant Examiner*—Hien N Nguyen
(74) *Attorney, Agent, or Firm*—Harness, Dickey & Pierce, P.L.C.

(57) ABSTRACT

A phase change random access (PRAM) memory may include a memory cell array having a plurality of phase change memory cells, and a data read circuit including a compensation unit and a sense amplifier, the compensation unit configured to provide a sensing node with a compensation current to compensate for a decrease in a level of the sensing node caused by a current flowing through one of the plurality of phase change memory cells, and the sense amplifier configured to compare a level of the sensing node with a reference level and output a result of the comparison.

28 Claims, 10 Drawing Sheets

U.S. PATENT DOCUMENTS

| | | |
|---|---|---|
| 7,113,424 B2 | 9/2006 | Happ et al. ............... 365/163 |
| 7,120,549 B2 | 10/2006 | Lee ........................... 702/99 |
| 7,149,103 B2 | 12/2006 | Ahn .......................... 365/148 |
| 7,248,526 B2 | 7/2007 | Ito et al. .................... 365/222 |
| 7,286,432 B2 | 10/2007 | Heilmann et al. ......... 365/211 |
| 7,315,469 B2 | 1/2008 | Choi et al. ................. 365/163 |
| 7,548,451 B2 * | 6/2009 | Oh et al. .................... 365/163 |
| 2006/0028886 A1 | 2/2006 | Choi et al. |
| 2008/0159017 A1 | 7/2008 | Kim et al. ............. 365/189.09 |
| 2008/0291715 A1 | 11/2008 | Park et al. .................. 365/148 |

FOREIGN PATENT DOCUMENTS

| | | |
|---|---|---|
| KR | 10-2005-0020356 | 3/2005 |
| KR | 10-2005-0029013 A | 3/2005 |
| KR | 10-2005-0107199 | 11/2005 |
| KR | 10-2006-0022009 A | 3/2006 |

OTHER PUBLICATIONS

Korean Office Action dated Aug. 29, 2007 for corresponding Korean Patent Application No. 10-2006-0085253.

* cited by examiner

FIG. 1

| | 1_1 | 1_2 | 1_3 | 1_4 | 1_5 | 1_6 | 1_7 | 1_8 |
|---|---|---|---|---|---|---|---|---|
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | SA/WD(2_1) | | SA/WD(2_2) | | SA/WD(2_3) | | SA/WD(2_4) | |
| | PERIPHERY(3) | | | | | | | |
| | SA/WD(2_8) | | SA/WD(2_7) | | SA/WD(2_6) | | SA/WD(2_5) | |
| | BLK7 | BLK7 | BLK7 | BLK7 | BLK7 | BLK7 | BLK7 | BLK7 |
| | BLK6 | BLK6 | BLK6 | BLK6 | BLK6 | BLK6 | BLK6 | BLK6 |
| | BLK5 | BLK5 | BLK5 | BLK5 | BLK5 | BLK5 | BLK5 | BLK5 |
| | BLK4 | BLK4 | BLK4 | BLK4 | BLK4 | BLK4 | BLK4 | BLK4 |
| | BLK3 | BLK3 | BLK3 | BLK3 | BLK3 | BLK3 | BLK3 | BLK3 |
| | BLK2 | BLK2 | BLK2 | BLK2 | BLK2 | BLK2 | BLK2 | BLK2 |
| | BLK1 | BLK1 | BLK1 | BLK1 | BLK1 | BLK1 | BLK1 | BLK1 |
| | BLK0 | BLK0 | BLK0 | BLK0 | BLK0 | BLK0 | BLK0 | BLK0 |
| | 1_16 | 1_15 | 1_14 | 1_13 | 1_12 | 1_11 | 1_10 | 1_9 |

FIG. 8
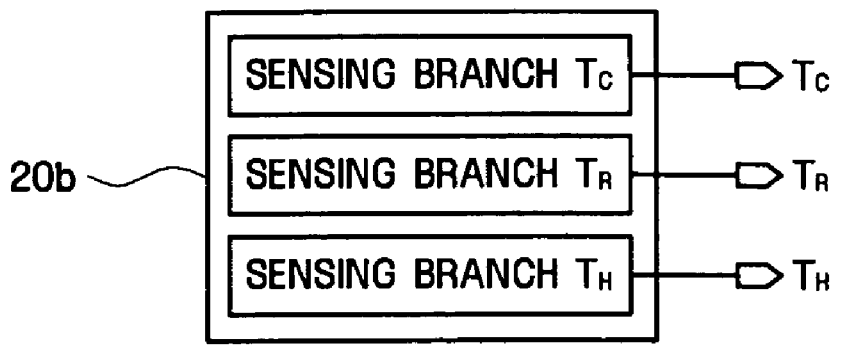
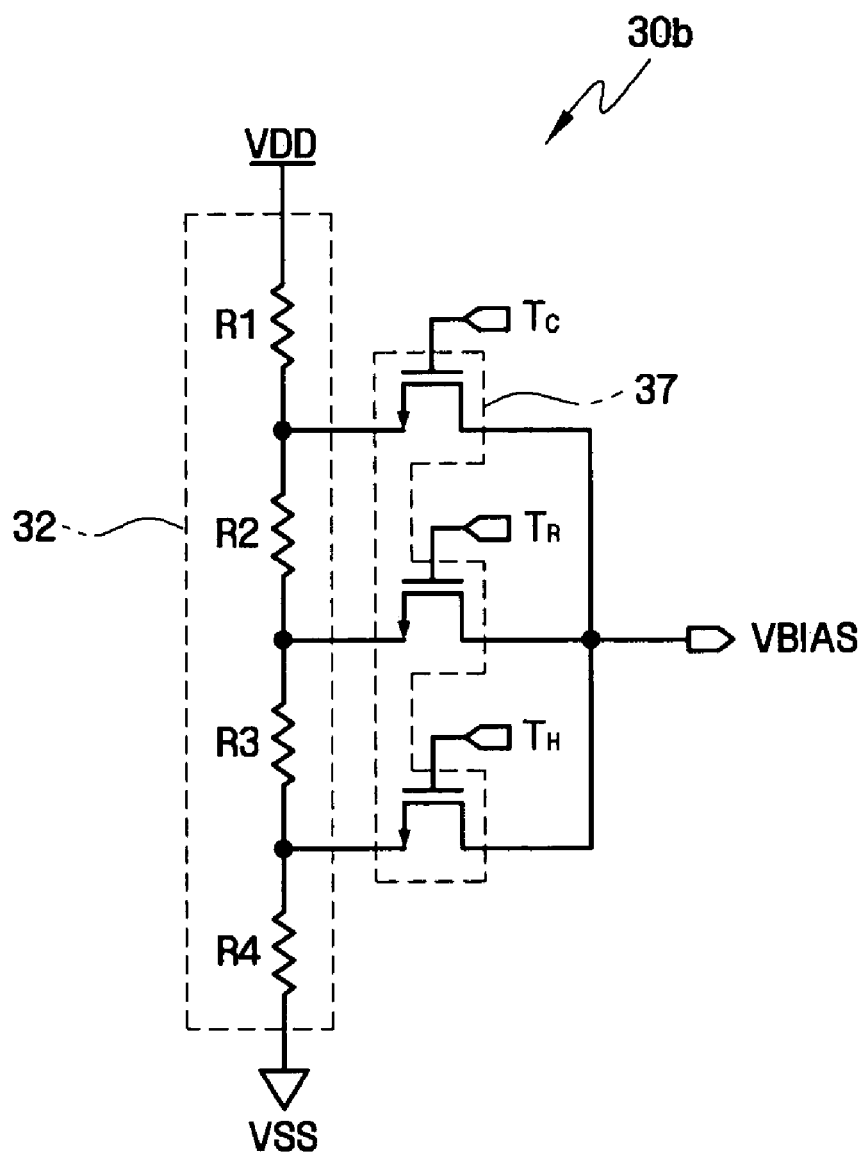

PHASE CHANGE RANDOM ACCESS MEMORY

PRIORITY STATEMENT

This application is a continuation under 35 U.S.C. §120 of U.S. application Ser. No. 11/896,721, filed Sep. 5, 2007. now U.S. Pat. No. 7,548,451, issued Jun. 16, 2009, which claims priority under 35 U.S.C. §119 to Korean Patent Application No. 10-2006-0085253, filed on Sep. 5, 2006 in the Korean Intellectual Property Office, the disclosure of each of which is incorporated herein its entirely by reference.

BACKGROUND

1. Field

Example embodiments may relate to a phase change random access memory, and more particularly, to a phase change random access memory having an enhanced reliability read operation.

2. Description of the Related Art

A phase Change Random Access Memory (PRAM) stores data using a phase change material, for example, a chalcogenide alloy. A state of the phase change material changes to a crystalline state or an amorphous state when the materials is heated or cooled. For example, when the phase change material in a crystalline state, it may have a low resistance, and the crystalline state is defined as "set" or data "0." When the phase change material in an amorphous state, it may have a high resistance, and the amorphous state is defined as "reset" or data "1."

A read operation of a PRAM may be described as follows. First, when a PRAM is to read, current may be applied to a selected one, pass through current that depends on the resistance of the phase change random access memory is generated. A sense amplifier compares a level of a sensing node, which may change depending on the pass through current, with a reference level, and identifies data as "0" or "1."

However, a resistance of the PRAM may decrease as the temperature rises. For example, a set resistance of 6 k$\Omega$ at 25° C. may change to 3.45 k$\Omega$ at 85° C., and a reset resistance of 150 k$\Omega$ at 25° C. may change to 50 k$\Omega$ at 85° C. The margin between the set resistance and the reset resistance may decrease because the decreasing extent of the reset resistance is higher than that of the set resistance; therefore, the sense amplifier may not correctly discriminate between the set state and the reset state. Further, in the case where the reset resistance greatly decreases, an operation error may occur in which the sense amplifier erroneously senses the reset state as the set state.

SUMMARY

In order to accomplish the aspects of example embodiments, a phase change random access memory (PRAM) may include a memory cell array having a plurality of phase change memory cells, and a data read circuit including a compensation unit and a sense amplifier, the compensation unit configured to provide a sensing node with a compensation current to compensate for a decrease in a level of the sensing node caused by a current flowing through one of the plurality of phase change memory cells and to control the compensation current according to a temperature of the PRAM, and the sense amplifier configured to compare a level of the sensing node with a reference level and output a result of the comparison.

BRIEF DESCRIPTION OF THE DRAWINGS

The above and other aspects of example embodiments may be better understood from the following detailed description taken in conjunction with the accompanying drawings, in which:

FIG. 1 is a block diagram illustrating a phase change random access memory (PRAM) according to an example embodiment;

FIGS. 7 to 9 are illustrative circuit diagrams of a temperature sensor and a compensation control signal generation circuit according to the PRAM illustrated in FIG. 2;

DESCRIPTION OF EXAMPLE EMBODIMENTS

Figure 2:
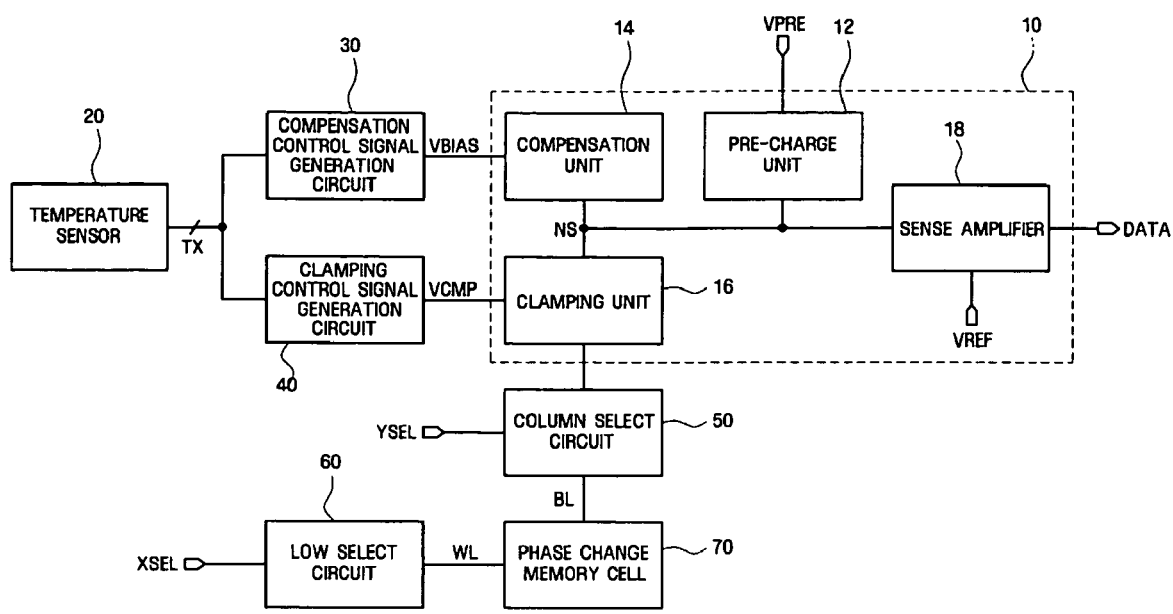
FIG. 2 is a different type of block diagram illustrating a phase change random access memory (PRAM) according to an example embodiment.

Reference now should be made to the drawings, in which the same reference numerals may be used throughout the different drawings to designate the same or similar components.

It will be understood that when an element or layer is referred to as being "on", "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-section illustrations that may be schematic illustrations of idealized embodiments (and intermediate structures). As such, variations from the shapes of the illustrations as a result, for example, of manufacturing techniques and/or tolerances, are to be expected. Thus, the example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to limit the example embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be described with reference to a phase change random access memory (PRAM). However, it may be apparent to those skilled in the art that the example embodiments may be applied to other non-volatile memory devices having resistors, for example, Resistive RAM (RRAM), Ferroelectric RAM (FRAM), and Magnetic RAM (MRAM).

FIG. 1 is a block diagram illustrating phase change random access memory according to example embodiments. Although FIG. 1 illustrates a PRAM having 16 memory banks, example embodiments are not limited thereto.

Referring to FIG. 1, a PRAM according to example embodiments may include a memory cell array, a plurality of sense amplifiers, and write drivers 2_1 to 2_8, and a peripheral circuit region 3.

The memory cell array may include a plurality of memory banks 1_1 to 1_16. Each of the plurality of memory banks 1_1 to 1_16 may include a plurality of memory blocks BLK0 to BLK7. Each of the plurality of memory blocks BLK0 to BLK7 may include a plurality of phase change memory cells 70 arranged in a matrix form (not shown). Although, in FIG. 1, eight memory blocks may be arranged in each of the plurality of memory banks 1_1 to 1_16, the example embodiment are not limited thereto. The phase change memory cell 70 may include a variable resistive element, which may include a phase change material having two different resistance values depending on whether it is in a crystalline state or an amorphous state, and an access element, which may control current flowing through the variable resistive element. The access element may be a diode or a transistor, which may be coupled in series to the variable resistive element. Furthermore, the phase change material may be a compound element, for example, GaSb, InSb, InSe, $Sb_2Te_3$, GeTe, GeTe, GeSbTe, GaSeTe, InSbTe, $SnSb_2Te_4$, InSbGe, AnInSbTe, (GeSn)SbTe, GeSb(SeTe) and $Te_{81}Ge_{15}Sb_2S_2$. Among the compound elements, GeSbTe, composed of Ge, Sb and Te, may be generally used.

Although not shown in the drawings, row select circuits and column select circuits for respectively assigning rows and columns of the phase change memory cells to write/read data to correspond to the memory banks 1_1 to 1_16 may be provided.

The sense amplifiers and write drivers 2_1 to 2_8 may be arranged to correspond to two memory banks 1_1 to 1_16 and perform read and write operations in the corresponding memory banks. Although in FIG. 1, the sense amplifiers and write drivers 2_1 to 2_8 correspond to 2 memory banks 1_1 to 1_16, example embodiments may not be limited thereto. The sense amplifiers and write drivers 2_1 to 2_8 may be configured to correspond to more than one memory bank.

A plurality of logic circuit blocks (not shown) and a voltage generator (not shown) for operating the column select circuits, the row select circuits 60, and the sense amplifiers and write drivers 2_1 to 2_8 may be arranged in the peripheral circuit region 3. A temperature sensor 20 (FIG. 2), a compensation control signal generation circuit 30 (FIG. 2), and a clamping control signal generation circuit 40 (FIG. 2) may also be arranged in the peripheral circuit region 3, which will be further described below.

Figure 3:
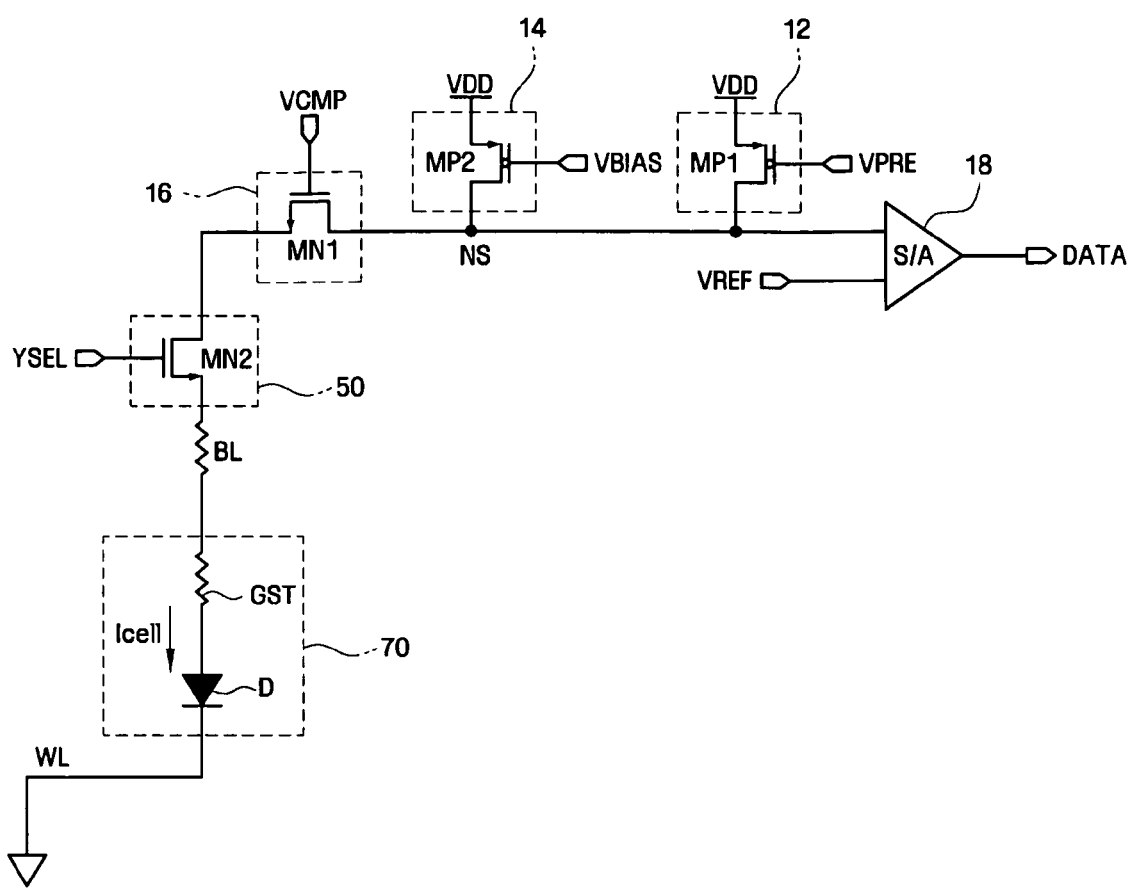
FIG. 3 is a circuit diagram of a PRAM according to an example embodiment.

FIG. 2 is a different type of block diagram illustrating a phase change random access memory (PRAM) according to an example embodiment. FIG. 3 is a circuit diagram of a PRAM according to an example embodiment.

Referring to FIGS. 2 and 3, the PRAM may include a data read circuit 10, a temperature sensor 20, a compensation control signal generation circuit 30, a clamping control signal generation circuit 40, a column select circuit 50, a row select circuit 60, and a phase change memory cell 70.

One of the phase change memory cells 70 may be selected in the memory cell array, for example, for a read operation. In more detail, the column select circuit 50 may be provided with a column select signal YSEL, and then the column select circuit may select a bit line BL. The row select circuit 60 may be provided with a row select signal XSEL. The row select circuit may select a word line WL. The selected bit line BL and world line WL may result in reading data from the selected phase change memory cell 70.

The data read circuit 10 may read data by applying current to the selected phase change memory cell 70 and sensing a level change at the sensing node SN generated by current Icell flowing through the selected phase change memory cell 70.

The data read circuit 10 may include a pre-charge unit 12, a compensation unit 14, a clamping unit 16, and a sense amplifier 18.

The pre-charge unit 12 may pre-charge the sensing node SN to a desired level, for example, the level of power voltage VDD during a pre-charge period before the sensing operation. The pre-charge unit 12 may be a PMOS transistor MP1 coupled between the power voltage VDD and the sensing node SN, and may receive a pre-charge control signal VPRE through its gate.

The compensation unit 14 may provide the sensing node SN with compensation current in order to compensate for a decrease in the level of the sensing node SN, which may be caused by the current Icell flowing through the selected phase change memory cell 70. In detail, when the phase change memory cell 70 is in a set state, the pass through current Icell may be high because the phase change material has a low resistance. In contrast, when the phase change memory cell 70 is in a reset state, the pass through current Icell may be low because the phase change material has a high resistance. The amount of the compensation current provided by the compensation unit 14 may reach a level to compensate for the pass through current Icell in a reset state. By doing so, the level of the sensing node SN in a reset state is kept constant, while the level of the sensing node SN in a reset state is lowered. Accordingly, since a difference between the level of the sensing node SN in a reset state and the level of the sensing node SN in a set state is large, it may be easier to discriminate between the set and reset states. Therefore, it may be possible to increase the sensing margin. The compensation unit 14 may be a PMOS transistor MP2 coupled between the power supply voltage VDD and the sensing node SN, and may receive a compensation control signal VBIAS through its gate.

The clamping unit 16 may function to clamp the level of the bit line BL within a range appropriate for reading data. In detail, the clamping unit 16 may perform clamping below the threshold voltage Vth of the phase change material. When a level above a threshold voltage Vth is reached, the phase of the phase change material of the selected phase change memory cell 70 may change. The clamping unit 16 may be an NMOS transistor MN1 that is coupled between the bit line BL and the sensing node SN and receive a clamping control signal VCMP through the gate thereof, as shown in FIG. 3.

The sense amplifier 18 may compare the level of the sensing node SN with a reference level REF, and output the results of the comparison. In an example embodiment, the sense amplifier 18 may be a current sense amplifier that senses a change in current flowing out from the bit line BL of the selected phase change memory cell 70 with respect to a reference current, or a voltage sense amplifier that senses a change in voltage with respect to a reference voltage.

However, in an example embodiment, the compensation unit 14 may also control the amount of the compensation current according to a change in temperature. Further, the clamping unit 16 may control the level of the bit line BL that is clamped according to a change in temperature. In other words, the clamping unit 16 may control the amount of clamping current flowing into the bit line BL coupled to the phase change memory cell 70 selected from the sensing node SN according to a change in temperature.

Figure 4:
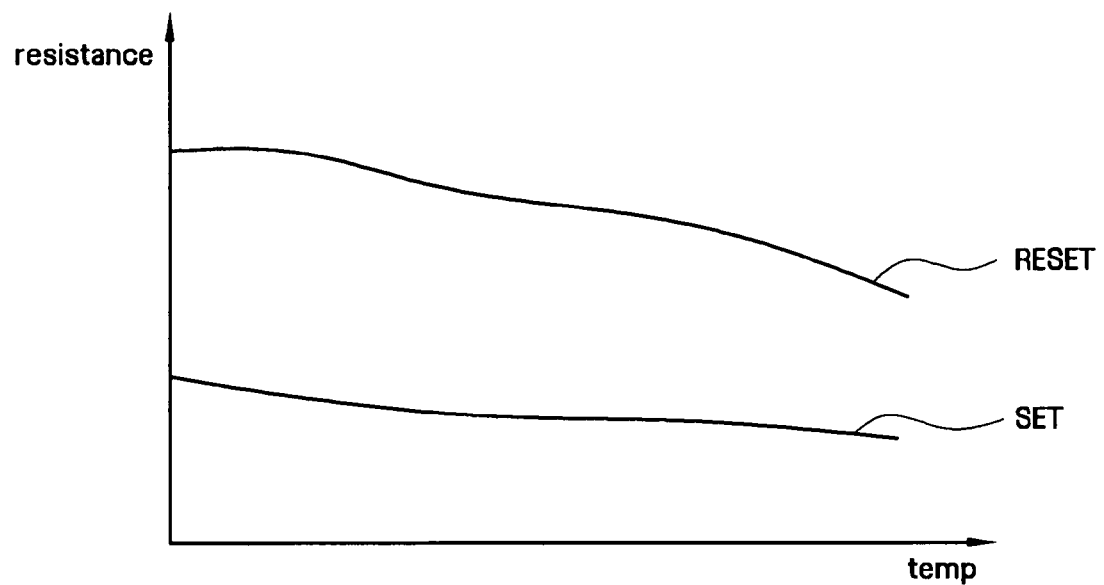
FIG. 4 is a correlation diagram between a phase change material and resistance according to a change in ambient temperature.
Figure 5:
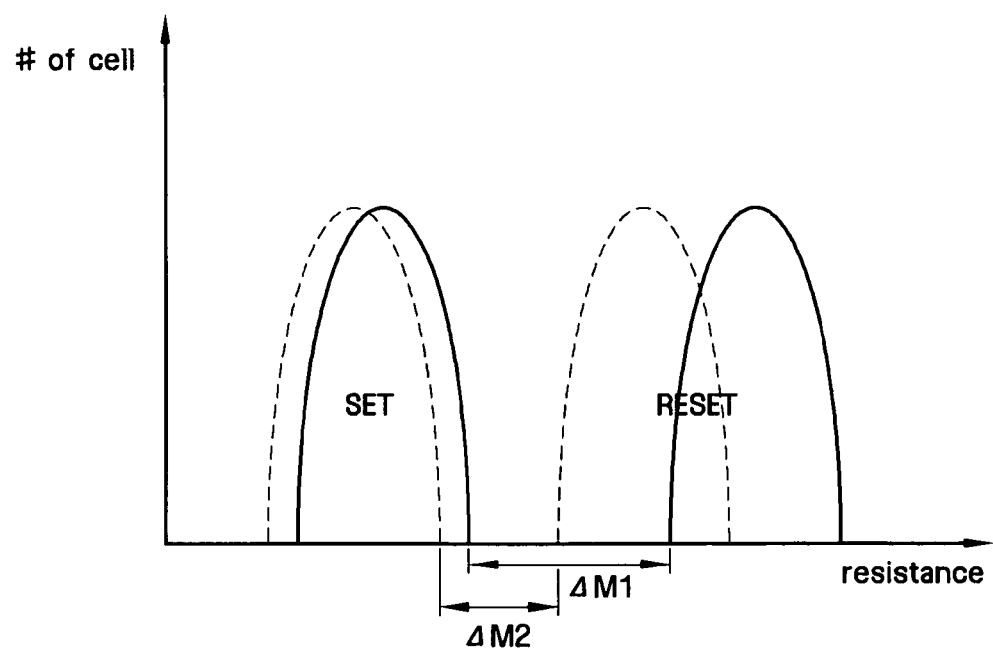
FIG. 5 is a diagram illustrating set and reset resistance distributions of a phase change memory cell depending on a change in ambient temperature.
Figure 6:
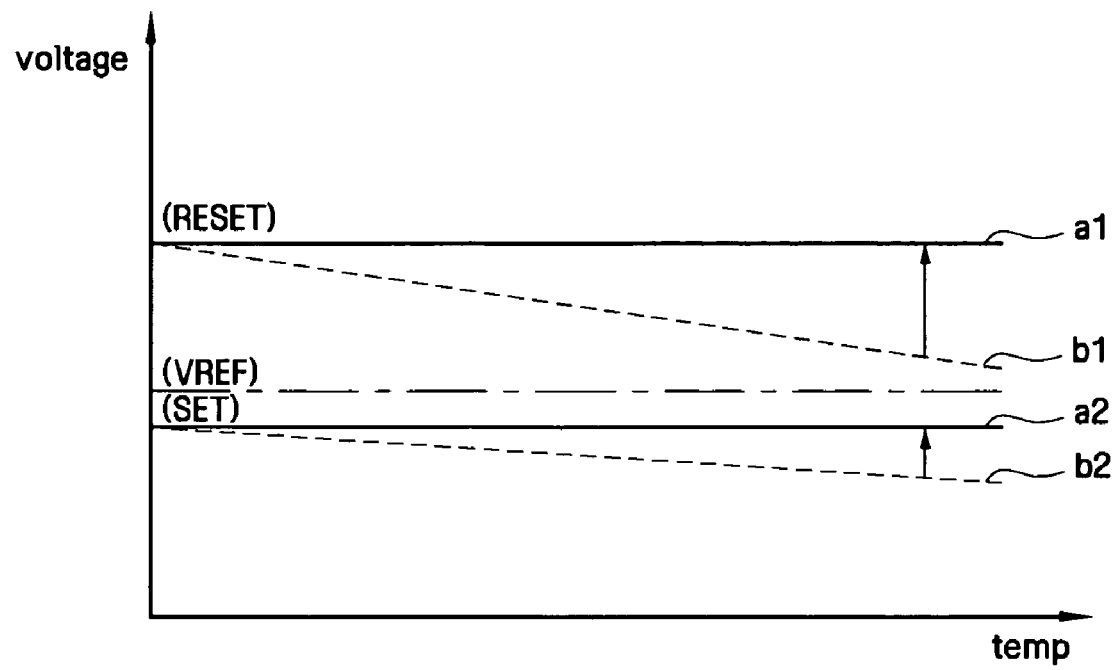
FIG. 6 is a diagram illustrating a change in a level of a sensing node depending on a change in ambient temperature.

FIG. 4 is a correlation diagram illustrating a phase change material and resistance according to a change in temperature. FIG. 5 is a diagram illustrating set and reset resistance distributions of a phase change memory cell depending on a change in temperature. FIG. 6 is a diagram illustrating a change in a level of a sensing node depending on a change in temperature.

As temperature rises, the set resistance and reset resistance of the phase change material may decrease, as illustrated in FIG. 4. For example, a set resistance of 6 k$\Omega$ at 25° C. may be 3.45 k$\Omega$ at 85° C., and a reset resistance of 150 k$\Omega$ at 25° C. may be 50 k$\Omega$ at 85° C. As illustrated in FIG. 4, the extent of the decrease in the reset resistance as the temperature rises may be higher than that in the set resistance. Accordingly, if the margin between the set resistance and the reset resistance is $\Delta M1$ at ambient temperature, as illustrated in FIG. 5, the margin between the set resistance and the reset resistance decreases to $\Delta M2$ at a temperature higher than ambient temperature.

Furthermore, since the set resistance and the reset resistance decrease as temperature rises, the pass through current Icell, which depends on the resistance of the phase change material, increases. Accordingly, when temperature rises, the level of the sensing node SN in a set state and the level of the sensing node SN in a reset state decrease, as illustrated in FIG. 6. In FIG. 6, the X-axis and the Y-axis respectively represent temperature and the voltage level of the sensing node SN. "a1" and "a2" respectively indicate the level of the sensing node SN in a reset state and the level of the sensing node SN in a set state at ambient temperature. "b1" and "b2" respectively indicate the level of the sensing node SN in a reset state and the level of the sensing node SN in a set state at a temperature higher than ambient temperature. As illustrated in FIG. 6, as temperature rises, the margin between the level of the sensing node SN in a set state and the level of the sensing node SN in a reset state decreases. Accordingly, the sense amplifier 18 may not correctly discriminate between a set state and a reset state, and therefore, may generate an operation error such that the sense amplifier may sense a reset state instead of a set state.

Accordingly, as temperature rises, the compensation unit 14 may increase the amount of compensation current and the clamping unit 16 may decrease the amount of clamping current. In other words, when the compensation unit 14 provides compensation current to the extent that an increase in current may be compensated for even if the amount of pass through current, which may depend on the resistance of the phase change material, increases. It may be possible to raise the level of the sensing node SN, as indicated by arrows in FIG. 6. Furthermore, since the amount of pass through current decreases when the clamping unit 16 decreases the clamping current, it may be possible to raise the level of the sensing node SN, as indicated by the arrows in FIG. 6. Accordingly, since the margin between the level of the sensing node SN in a set state and the level of the sensing node SN in a reset state may be obtained, operational errors of the sense amplifier 18 may be reduced, and the reliability of the phase change random access memory may also be enhanced.

A detailed example of an increase in the amount of compensation current or a decrease in the amount of clamping current will be described below.

Referring to FIGS. 2 and 3, a PRAM according to an example embodiment may include a temperature sensor 20 that may react to ambient temperature and provide a temperature signal Tx. A compensation control signal generation circuit 30 and a clamping control signal generation circuit 40 may each receive the temperature signal Tx, and respectively generate a compensation control signal VBIAS and a clamping control signal VCMP, reflecting the temperature characteristics. In detail, when the temperature rises, the compensation control signal generation circuit 30 and the clamping control signal generation circuit 40 may decrease the voltage level of the compensation control signal VBIAS and the voltage level of the clamping control signal VCMP, respectively.

When the voltage level of the compensation control signal VBIAS decreases, the PMOS transistor of the compensation unit 14 may decrease the amount of compensation current. In contrast, when the voltage level of the clamping control signal VCMP decreases, the NMOS transistor MN1 of the clamping unit 16 may decrease the amount of clamping current.

Figure 7:
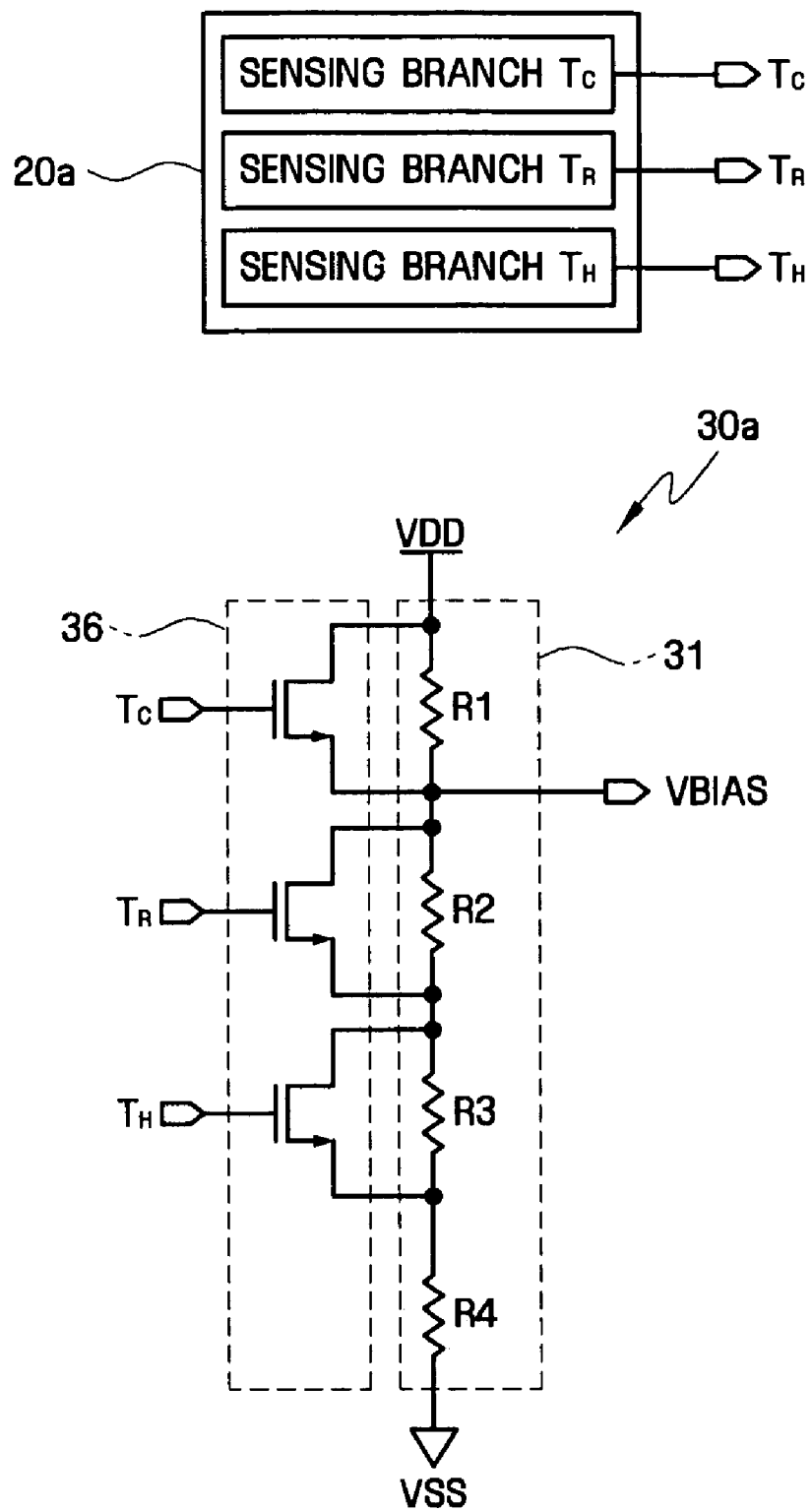
Figure 9:
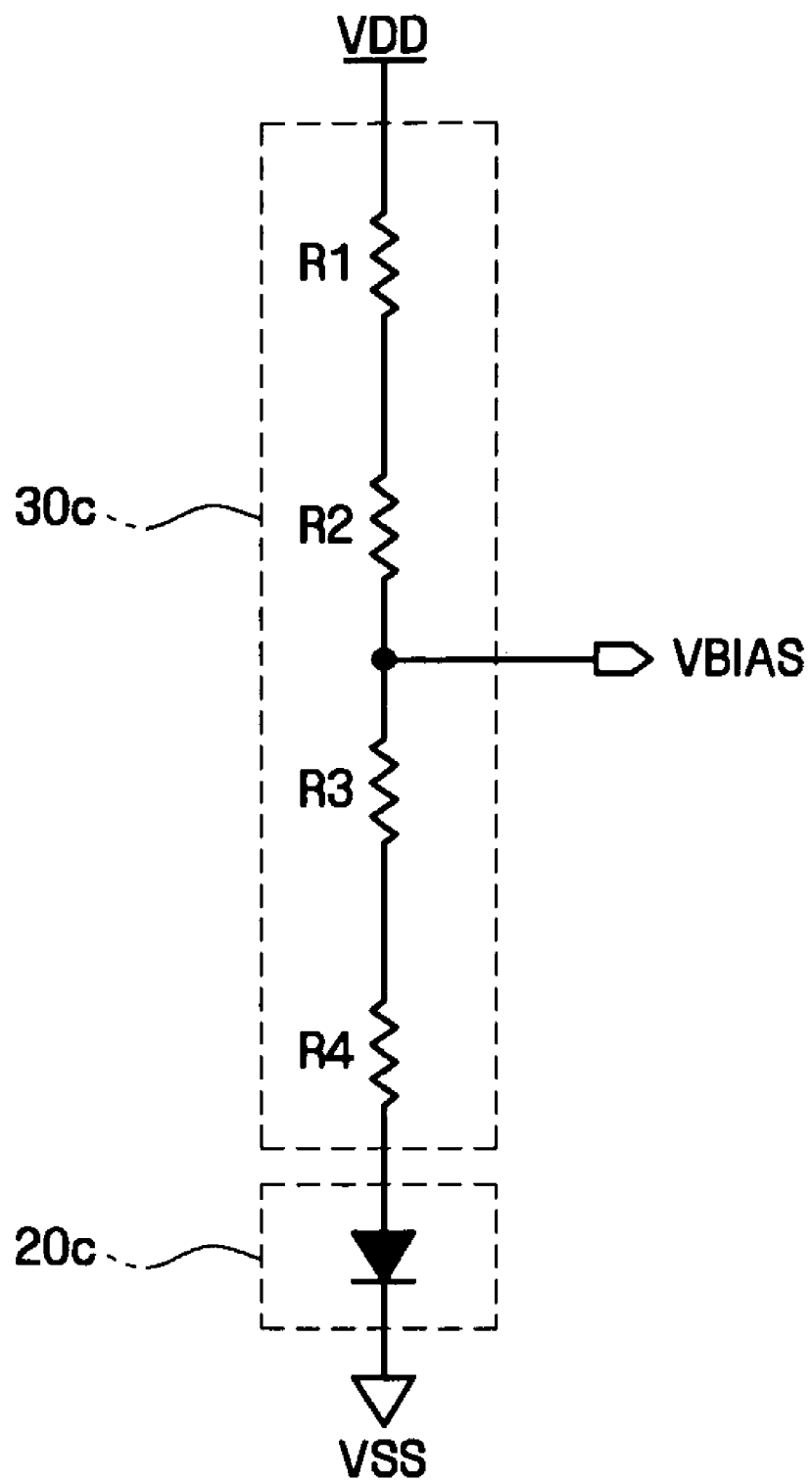

Examples of the temperature sensor 20, the compensation control signal generation circuit 30, and the clamping control signal generation circuit 40 are illustrated in FIGS. 7 to 9. Although FIGS. 7 to 9 only show the compensation control signal generation circuit 30, the circuit illustrated in FIGS. 7 to 9 may also be applied to the clamping control signal generation circuit 40. The circuits shown in FIGS. 7 to 9 are only for illustrative purposes.

Referring to FIG. 7, the temperature sensor 20a may include a plurality of temperature sensing branches which react to different temperatures and output temperature signals TR, TH and TC. For example, the temperature sensor 20a may include a sensing branch TR for sensing ambient temperature, a sensing branch TH for sensing a temperature higher than ambient temperature, and a sensing branch TC for sensing a temperature lower than ambient temperature. When temperature of the PRAM becomes higher than ambient temperature, the temperature signal TH also becomes high, and the temperature signal TH becomes low.

The compensation control signal generation circuit 30a may include a resistor array 31 configured to have a plurality of resistors R1 to R4, and a plurality of NMOS transistors 36 connected between a plurality of nodes of the resistor array 31, and configured to be turned on in response to the temperature signals, TR, TH and TC. Values of the plurality of resistors R1 to R4 may be, for example, R1<R2<R3<R4. The level of the compensation control signal VBIAS output in response to the temperature signal TH may be lower than that of compensation control signals VBIAS output in response to the other temperature signals TR and TC.

Referring to FIG. 8, the temperature sensor 20b may include a plurality of temperature sensing branches TR, TR and TC, which may output temperature signals TR, TH and TC, respectively, in response to different temperatures.

The compensation control signal generation circuit 30b may include a resistor array 32 configured to include a plurality of resistors R1 to R4, and a plurality of NMOS transistors 37 may be connected between a plurality of nodes of the resistor array 32 and a voltage output node and configured to be turned on in response to the temperature signals TR, TH and TC.

Referring to FIG. 9, the temperature sensor 20c may include a diode, and the compensation control signal generation circuit 30c may include a resistor array in which a plurality of resistors R1 to R4 may be connected in a series. The diode and the plurality of resistors may be connected in a series with respect to each other. Since the resistance of the diode may become high when temperature rises, the level of the compensation control signal VBIAS may decrease when temperature rises.

Figure 10:
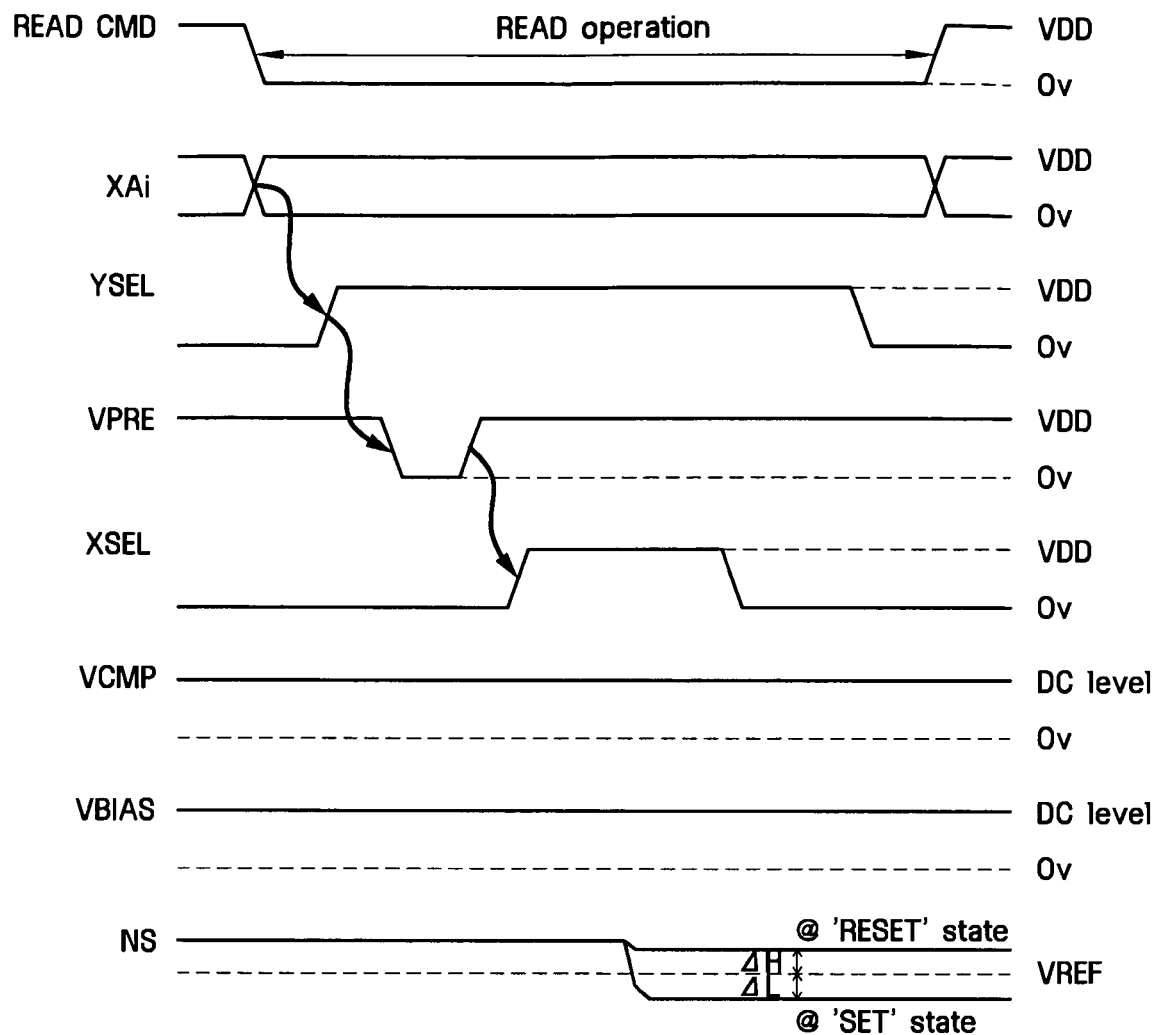
FIG. 10 is a timing diagram illustrating a read operation of the PRAM according to an example embodiment.

FIG. 10 is a timing diagram illustrating a read operation of a PRAM according to an example embodiment.

A read operation may be performed when temperature of the PRAM is higher than ambient temperature.

First, a read operation may start in response to an input of a read command, a column select signal YSEL may become high in synchronization with an input address XAi, and a bit line BL may be selected.

Subsequently, a pre-charge control signal VPRE may become low in synchronization with the column select signal YSEL. Accordingly, the transistor MP1 of the pre-charge unit 12 may pre-charge the sensing node SN to the level of the power supply voltage VDD.

Thereafter, when the pre-charge control signal VPRE becomes high, the low select signal XSEL may become high in synchronization with the pre-charge control signal so that a word line WL may be selected.

Further, when the pre-charge operation is terminated and a sensing operation starts, the clamping unit 16 may clamp the level of the bit line BL within a region appropriate for reading data. In detail, the clamping unit 16 may clamp the level of the bit line BL to a desired level below the threshold voltage Vth of the phase change material. For example, when the threshold voltage of the phase change material is about 1.2 V, the level of the bit line BL may be clamped at about 0.5 V to 1.0 V. The clamping unit 16 may provide a clamping current lower than that provided at ambient temperature. Although a clamping control signal VCMP may have the form of a constant voltage, as illustrated in FIG. 10, the clamping control signal VCMP may have the form of a pulse which may be activated only during a read operation.

Furthermore, the compensation unit 14 may provide the sensing node SN with a compensation current in order to compensate for a decrease in the level of the sensing node SN caused by the pass through current Icell flowing through the selected phase change memory cell 70. In particular, the compensation unit 14 may provide an amount of compensation current which may be larger than that provided at ambient temperature. Although the compensation control signal VBIAS may have the form of a constant voltage, as illustrated in FIG. 10, the compensation control signal VBIAS may have the form of a pulse type which may be activated only during the read operation.

In such a state, a pass through current Icell depending on the resistance of the selected phase change memory cell 70 may be generated. When the phase change memory cell 70 is in a set state, the amount of pass through current Icell may be large because the resistance of the phase change material is low. In contrast, when the phase change memory cell 70 is in a reset state, the amount of the pass through current Icell may be small because the resistance of the phase change material is high. However, since the compensation unit 14 may uniformly provide the compensation current, the level of the sensing node SN may be uniformly maintained in a reset state, and may decrease in a set state. Accordingly, the sense amplifier 18 may sense the difference ΔH between the level of the sensing node SN in a reset state and a reference level VREF, or the difference ΔL between the level of the sensing node SN in a set state and the reference level VREF.

According to an example embodiment, it may be noted that as temperature rises, the compensation unit 14 may increase the amount of compensation current and the clamping unit 16 may decrease the amount of clamping current so that the level of the sensing node SN in a reset state may be uniformly maintained.

Figure 11:
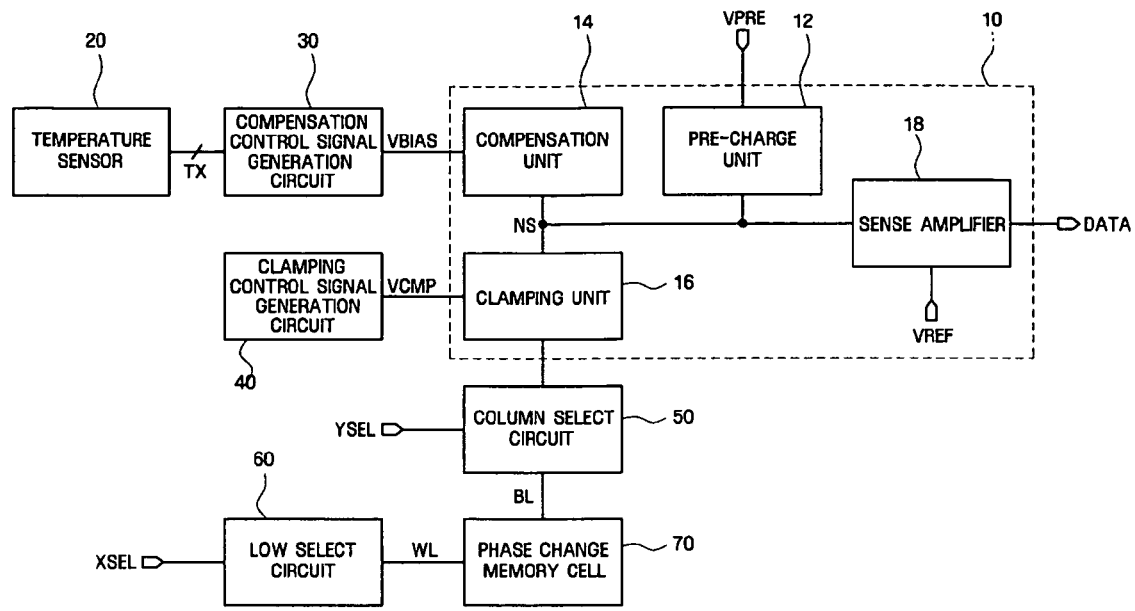
FIG. 11 is a block diagram illustrating a PRAM according to another example embodiment.
Figure 12:
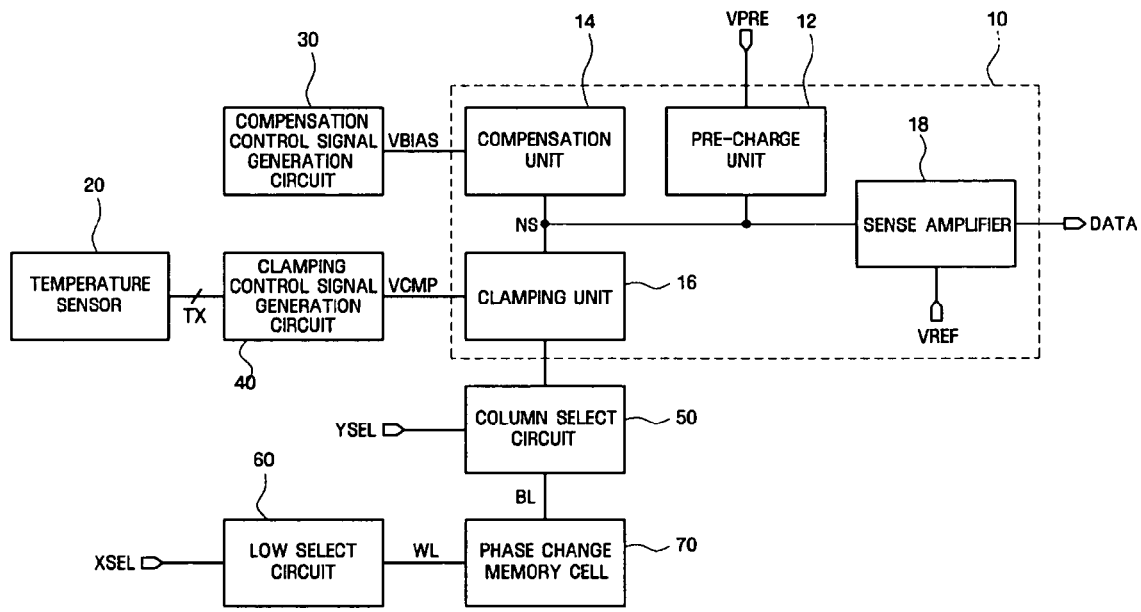
FIG. 12 is a block diagram illustrating a PRAM according to yet another example embodiment.

FIG. 11 is a block diagram illustrating a PRAM according to another example embodiment. FIG. 12 is a block diagram illustrating a PRAM according to yet another example embodiment.

In the PRAM according to example embodiment illustrated in FIG. 11, because only the compensation control signal generation circuit 30 may be provided with the temperature signal Tx of the temperature sensor 20, only the compensation unit 14 may control the amount of compensation current according to the change in temperature. On the hand, in the PRAM according to yet another example illustrated in FIG. 12, because only the clamping control signal generation circuit 40 may be provided with the temperature signal Tx of the temperature sensor, only the clamping unit 16 may control the amount of clamping current according to the change in temperature.

Example embodiments relate to a PRAM having a more reliable read operation. If the temperature of the PRAM increases, a set resistance and reset resistance may change.

Accordingly, the resistance margin between the set resistance and reset resistance may be small. In some example embodiments, the PRAM may include a compensation unit, a clamping unit, a compensation-control-signal-generation circuit, a clamping-control-signal-generation circuit, a temperature sensor, and/or a sense amplifier.

The compensation unit may control the amount of compensation current according to the temperature of the PRAM in response to a compensation-control signal. The compensation-control-signal-generation circuit controls the voltage level of the compensation-control signal by receiving the temperature signal from the temperature sensor.

The clamping unit may control the amount of clamping current according to the temperature of the PRAM in response to a clamping-control signal. The clamping-control-signal-generation circuit may control the voltage level of the clamping control signal by receiving the temperature signal from the temperature sensor.

Example embodiments of phase change random access memories described above may ensure a margin between a set state and a reset state with respect to a change in temperature by increasing the amount of compensation current or decreasing the amount of clamping current according to the change in temperature. Accordingly, it may be possible to decrease the number of operational errors of the sense amplifier caused by the temperature change, and to enhance the reliability of the read operation of the PRAM.

While example embodiments have been shown and described, it will be understood by those skilled in the art that various changes and modifications may be made without departing from the scope of the example embodiments.

What is claimed is:

1. A variable resistive memory, comprising:
a memory cell array having a plurality of variable resistive memory cells; and
a data read circuit including a compensation unit and a sense amplifier, the compensation unit configured to provide a sensing node with a compensation current to compensate for a decrease in a level of the sensing node caused by a current flowing through one of the plurality of variable resistive memory cells and to control the compensation current according to a temperature of the variable resistive memory and the sense amplifier configured to compare a level of the sensing node with a reference level and output a result of the comparison.

2. The variable resistive memory of claim 1, wherein the compensation unit is configured to increase the amount of compensation current as the temperature of the variable resistive memory rises.

3. The variable resistive memory of claim 2, wherein the compensation unit is a PMOS transistor coupled between a power supply voltage and the sensing node, and the PMOS transistor is turned on in response to a compensation control signal.

4. The variable resistive memory of claim 3, further including: a compensation control signal generation circuit configured to generate the compensation control signal.

5. The variable resistive memory of claim 3, wherein a voltage level of the compensation control signal becomes low as the temperature of the variable resistive memory rises.

6. The variable resistive memory of claim 1, further comprising: a clamping unit configured to control an amount of clamping current flowing into a bit line coupled with the one of the plurality of variable resistive memory cells from the sensing node in response to a clamping control signal.

7. The variable resistive memory of claim 6, further comprising: a clamping control signal generation circuit configured to generate the clamping control signal.

8. The variable resistive memory of claim 6, wherein the clamping unit is configured to decrease the amount of clamping current as the temperature of the variable resistive memory rises.

9. The variable resistive memory of claim 6, wherein the clamping unit is an NMOS transistor coupled between the bit line and the sensing node, and the clamping unit is turned on in response to the clamping control signal.

10. The variable resistive memory of claim 6, wherein a voltage level of the clamping control signal becomes low as the temperature of the variable resistive memory rises.

11. The variable resistive memory of claim 4, further comprising: a temperature sensor configured to measure a temperature of the variable resistive memory and transmit a temperature signal to the compensation control signal generation circuit.

12. The variable resistive memory of claim 7, further comprising: a temperature sensor configured to measure a temperature of the variable resistive memory and transmit a temperature signal to the clamping control signal generation circuit.

13. The variable resistive memory of claim 4, further comprising: a clamping unit configured to control an amount of clamping current flowing into a bit line coupled with the one of the plurality of variable resistive memory cells from the sensing node in response to a clamping control signal, and a clamping control signal generation circuit configured to generate the clamping control signal.

14. The variable resistive memory of claim 13, further comprising: a temperature sensor configured to measure a temperature of the variable resistive memory and transmit a temperature signal to the compensation control signal generation circuit and the clamping control signal generation circuit.

15. The variable resistive memory of claim 14, wherein the temperature sensor includes a plurality of temperature sensing branches, each of the plurality of temperature sensing branches configured to output a different temperature signals in response to different temperatures measure by the temperature sensor.

16. The variable resistive memory of claim 15, wherein at least one of the compensation control signal generation circuit and the clamping control signal generation circuit includes a resistor array having a plurality of resistors, and a plurality of transistors connected between a plurality of nodes of the resistor array and adapted to turned on in response to the temperature signal.

17. The variable resistive memory of claim 15, wherein at least one of the compensation control signal generation circuit and the clamping control signal generation circuit includes a resistor array having a plurality of resistors, and a plurality of transistors connected between a plurality of nodes of the resistor array and a voltage output node and adapted to turned on in response to the temperature signal.

18. The variable resistive memory of claim 15, wherein the temperature sensor includes a diode, and at least one of the compensation control signal generation circuit and the clamping control signal generation circuit includes a resistor array connected in series to the diode.

19. The variable resistive memory of claim 3, wherein the compensation control signal is at least one of a constant voltage and a pulse.

20. The variable resistive memory of claim 6, wherein the clamping control signal is at least one of a constant voltage or a pulse.

21. The variable resistive memory claim 1, wherein the variable resistive memory cell includes a phase change material, and the phase change material includes a variable resistive element and an access element.

22. The variable resistive memory of claim 21, wherein the access element is at least one of a diode and a transistor connected in series to the variable resistive element.

23. The variable resistive memory of claim 21, wherein the phase change material is selected from GaSb, InSb, InSe, $Sb_2Te_3$, GeTe, GeTe, GeSbTe, GaSeTe, InSbTe, $SnSb_2Te_4$, InSbGe, AnInSbTe, (GeSn)SbTe, GeSb(SeTe) and $Te_{81}Ge_{15}Sb_2S_2$.

24. A driving method of variable resistive memory comprising;
  providing a sensing node with a compensation current to compensate for a decrease in a level of the sensing node caused by a current flowing through one of the plurality of variable resistive memory cells according to a temperature of the variable resistive memory; and
  comparing a level of the sensing node with a reference level to output a result of the comparison.

25. The driving method of variable resistive memory of claim 24, wherein the amount of compensation current increase as the temperature of the variable resistive memory rises.

26. The driving method of variable resistive memory of claim 24, further comprising,
  controlling an amount of clamping current flowing into a bit line coupled with the one of the plurality of variable resistive memory cells from the sensing node in response to a clamping control signal.

27. The driving method of variable resistive memory of claim 26, wherein the amount of clamping current decrease as the temperature of the variable resistive memory rises.

28. A variable resistive memory, comprising:
  a memory cell array having a plurality of variable resistive memory cells; and
  a data read circuit including a clamping unit and a sense amplifier, the clamping unit configured to control an amount of clamping current flowing into a bit line coupled with the one of the plurality of variable resistive memory cells from a sensing node according to a temperature of the variable resistive memory and the sense amplifier configured to compare a level of the sensing node with a reference level and output a result of the comparison.

* * * * *